United States Patent [19]

Nakayama

[11] Patent Number: 5,796,483
[45] Date of Patent: Aug. 18, 1998

[54] METHOD AND APPARATUS FOR POSITION SENSING

[75] Inventor: Shigeru Nakayama, Tokyo, Japan

[73] Assignee: Nikon Corporation, Tokyo, Japan

[21] Appl. No.: 761,115

[22] Filed: Dec. 6, 1996

[30] Foreign Application Priority Data

Dec. 7, 1995 [JP] Japan ................... 7-318727

[51] Int. Cl.$^6$ ............................................ G01B 9/02
[52] U.S. Cl. .......................... 356/349; 356/363; 356/401; 250/548
[58] Field of Search ............................ 356/349, 363, 356/401; 250/548

[56] References Cited

U.S. PATENT DOCUMENTS 4,710,026  12/1987  Magome et al.
4,856,905  8/1989  Nishi ........................... 356/401
5,151,750  9/1992  Magome et al.

*Primary Examiner*—Frank G. Font
*Assistant Examiner*—Robert Kim
*Attorney, Agent, or Firm*—Michael N. Meller

[57] ABSTRACT

Using an LIA alignment sensor, consecutive sensings of a reference-mark position are taken. $I(\omega)$, the power spectrum of the fluctuations of these sensings in a time period is computed. $I'(\omega)$, the power spectrum of the averaged fluctuations for an averaging time $\Delta T$ that changes between two different measurement times $\Delta T1$ and $\Delta T2$ is then computed. The dispersion of the data averaged during this averaging time $\Delta T$ matches the integral of the power spectrum $I'(\omega)$. The time period during which the value of the integral of the power spectrum $I'(\omega)$ reaches its lowest value is used as the measurement time of the position based on the beat signal obtained by the alignment sensor.

8 Claims, 4 Drawing Sheets

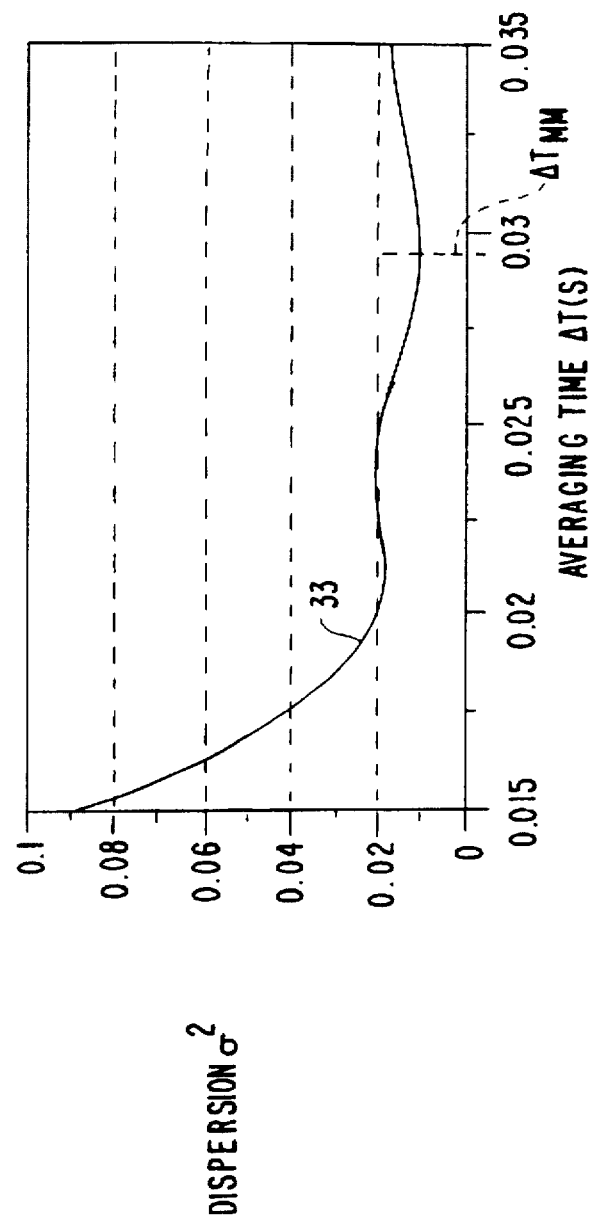

METHOD AND APPARATUS FOR POSITION SENSING

BACKGROUND OF THE INVENTION

1. Technical Field of the Invention

The present invention relates to a position-sensing method and apparatus. More particularly, the present invention relates to a method and apparatus in which the position of a diffraction-grating-type mark is sensed based on a beat signal. The beat signal is obtained through photoelectric conversion of an interference beam made up of multiple diffraction beams of mutually differing frequencies from a diffraction-grating-type mark. It is particularly directed to those methods and apparatus intended for use in position sensing using laser-interferometric-alignment (LIA) type alignment sensors installed in exposure systems. Such systems can be used in photolithography processes for manufacturing, for example, semiconductor devices, liquid-crystal-display devices, image-pickup devices (CCDs, etc.), or thin-film magnetic heads, etc.

2. Prior Art

In recent years, laser-step-alignment (LSA) stepper-type reduction-projection exposure systems have been widely used in step-and-repeat photolithography processes. The purpose is to provide a high-resolution image transfer of the circuit pattern (mask) from the reticle on the mask to the shot areas of the wafer (photosensitive substrate) during manufacture of semiconductor devices, for example. In semiconductor devices, however, multiple circuit pattern layers are formed superimposed in a given positional relationship on the wafer. Therefore, when the second and subsequent circuit pattern layers are formed, a wafer alignment procedure must be performed to align the position of the projected image of the reticle pattern to be exposed with the shot areas of the wafer on which circuit patterns have previously been formed. To do this accurately, the system must first sense the precise positions of the shot areas on the wafer. Prior exposure systems have, therefore, had alignment sensors to sense the location of the alignment marks on the wafer (wafer marks) provided at each shot area.

Previously known alignment sensors include that disclosed in U.S. Pat. No. 4,710,026 (Japanese Kokai No. S61-215905) which is capable of extremely high precision sensing of the wafer position. This is a laser-interferometric-alignment (LIA) type laser sensor that senses wafer-mark locations by directing two laser beams differing in frequency by a specific amount, from two different directions, onto a diffraction-grating-type wafer mark. At the wafer mark, the two laser beams interfere, generating a heterodyne beam, which is then photoelectrically converted to generate an electrical beat signal. The sensor then senses the locations of the wafer marks based on the phase of the beat signal. This LIA alignment technique is also referred to as two-beam interference alignment.

In other words, the LIA technique involves directing laser beams onto a diffraction-grating-type wafer mark from two different directions to produce a first-order interference pattern on the wafer mark. This interference pattern, of a specific pitch in the measured direction, is then used to sense the location of the mark. When this is done, the interference pattern at the beat frequency "flows" across the wafer mark in the pitch direction at high speed. The position of the mark is derived from the high-speed migration of the interference pattern, with the time element (phase difference) as a reference.

This LIA-mode alignment sensor uses diffraction-grating-type marks made up of multiple grating elements, which makes it robust with respect to the roughness of the wafer surface and can disrupt the wafer surface due to the various fabrication processes. Moreover, the LIA technique provides extremely high measurement resolution.

When the ±1-order diffraction beams from the wafer mark are used, for example, a positional displacement of only one-half of the grating pitch results in a full 360-degree shift in the phase of a sinusoidal beat signal corresponding to the intensity of the interference light from the wafer mark. When this is done, the phase difference of the beat signal might be determined, for example, by generating a reference-beat signal of the same frequency as the beat frequency, and finding the difference between the phase of the beat signal and that of the reference signal.

Alignment methods include the TTL (through the lens) method, in which the wafer-mark position is sensed through the projection optics; "off axis" methods, which sense the wafer-mark position directly without going through the projection optics; and the TTR (through the reticle) method, in which the reticle and the wafer are observed simultaneously to sense the amount of relative positional displacement between the two. Any of these methods can be used with LIA alignment sensors.

When LIA alignment sensors are used in TTL or off-axis alignment methods, the phase difference between the wafer mark and the reticle beat signals is detected as described above. On the other hand, when LIA alignment sensors are used in a TTR alignment mode, the phase difference that is detected is that between a beat signal corresponding to a wafer mark and a beat signal corresponding to a reticle mark.

As discussed above, conventional LIA alignment sensors are capable of performing fast, highly accurate, sensing of diffraction-grating-type wafer marks. Because the LIA technique utilizes light interference, however, these sensors are easily influenced by such factors as air movement and equipment vibration. Consequently, they exhibit a phenomenon in which, over a given range, there are rapid variations in the wafer positions (or the amount of relative positional displacement between two marks) as sensed based on the beat signal.

For this reason, in order to sense wafer-mark positions with the desired measurement precision, the system must be operated in a mode wherein beat-signal-based wafer-position sensing readings are sampled at a prescribed sampling frequency and averaged. When this is done, as the time over which the averaging is performed (the measurement time) is lengthened, the sensed position gets closer to the actual position, and the averaging becomes more effective. Unconditionally increasing the measurement time, however, brings disadvantages in that it increases the measurement time, consequently degrading the throughput (productivity) of the overall exposure process.

In consideration of the foregoing, it is an object of the present invention to provide a position-sensing method and apparatus that is capable of performing accurate position sensing without excessively increasing measurement time.

SUMMARY OF THE INVENTION

With the above object in mind, the present invention is directed to a method for establishing the desired measurement time for sensing the position of a diffraction-grating-type mark using a beat signal developed from at least two laser beams impinging on the mark. The method includes sequentially reading the position of the mark during two different measurement time periods based on the phase of the beat signal, and computing the power spectrum of the averaged fluctuations in such readings for an averaging time between the two different time periods. Also included is the step of computing the integral of the power spectrum whereby the averaging time during which the integral is at its lowest value equals the desired measuring time.

An example of the present invention includes sequentially reading the position of the mark based on the phase of the beat signal to provide a first time-series data, and computing a first power spectrum of any fluctuations occurring in the first time-series data. Sequential readings of the position of the mark are then taken during two different time periods to provide a second time-series data. Also included are the steps of computing a second power spectrum of averaged fluctuations in the readings for an averaging time between the two different time periods, and computing the integral of the second power spectrum whereby the averaging time during which the integral is at its lowest value equals the desired measuring time.

It is a feature of the present invention to provide a position-sensing apparatus that includes means for emitting two light beams having interferability and mutually differing frequencies onto a diffraction-grating-type mark formed on a substrate from different directions, and means for generating a beat signal by photoelectric detection of interference light made up of diffraction light of each of the two light beams from the diffraction-grating-type mark. Means for sensing the position of the diffraction-grating-type mark are included based on the phase of the beat signal. Finally, means are included for using the averaging time during which fluctuations of the sensed position are at their lowest in measurement results averaged in a specific range of averaging times of positions sensed based on the phase of the beat signal as the measurement time of the position of the diffraction-grating-type mark.

It is a further feature of the present invention to provide a position-sensing apparatus including means for determining a first power spectrum of fluctuations in positions sensed based on the phase of the beat signal, and means for computing from the first power spectrum, a second power spectrum of fluctuations in measurement results averaged during each averaging time within the range of specific averaging times. Also included are means for computing the integral of the second power spectrum, and means for using the averaging time during which the integral is at its lowest value as the measurement time of the position of the diffraction-grating-type mark.

According to an example of the present invention, within a specific range of averaging times, the averaging time during which the fluctuation is at a minimum is used as the measurement time. Thus with the measurement time in this optimized state, position sensing can be performed with high precision without increasing the measurement time.

When doing this, it is desirable to determine the power spectrum of the fluctuations in the positions sensed based on the phase of the beat signal (SD), and from this power spectrum to determine the power spectrum of the fluctuation in measurement results averaged during each averaging time within a specific averaging time range, and the integral of this power spectrum, and to then take the averaging time during which this integral is minimum as the measurement time of the position of the diffraction-grating-type mark (WMx). In other words, a position XM detected based on the phase of the beat signal (SD) at a specific sampling frequency, for example, oscillates at a high speed. Accordingly, if the frequency of the oscillation is f, and the angular frequency is ω (where ω=2πf), then I(ω), the power spectrum of the fluctuation in the position XM sensed in this manner in a time-series fashion can be determined.

The power spectrum Γ(ω) of the time-series data of these fluctuations averaged over each time ΔT is given by the following equation.

$$\Gamma(\omega)=I(\omega)\{\sin(\omega\Delta T/2)/(\omega\Delta T/2)/(\omega\Delta T/2)\}^2 \quad \text{Equation 1}$$

Now, $\sigma^2$, the dispersion of the time-series data of the fluctuation of the sensed position XM matches the integral of the power spectrum Γ(ω). Accordingly, $\Delta T_{MM}$, the averaging time within a specific measurement time range during which the integral of the power spectrum Γ(ω), at its lowest is found. Then by making this averaging time ($\Delta T_{MM}$) the measurement time of the position XM determined in time-series fashion from the phase of the beat signal (SD) (the time over which the sensed data is averaged), it is possible to effect highly accurate sensing (dispersal) over a short measurement time, with low sensed data fluctuations.

BRIEF DESCRIPTION OF THE DRAWINGS

The above and other objects, features, and advantages of the present invention will become more apparent from the following detailed description taken with the accompanying drawings, in which:

FIG. 5 shows an example of the results of integration of a power spectrum of time-series data for sensed positions.

DESCRIPTION OF THE PREFERRED EMBODIMENTS

Figure 1:
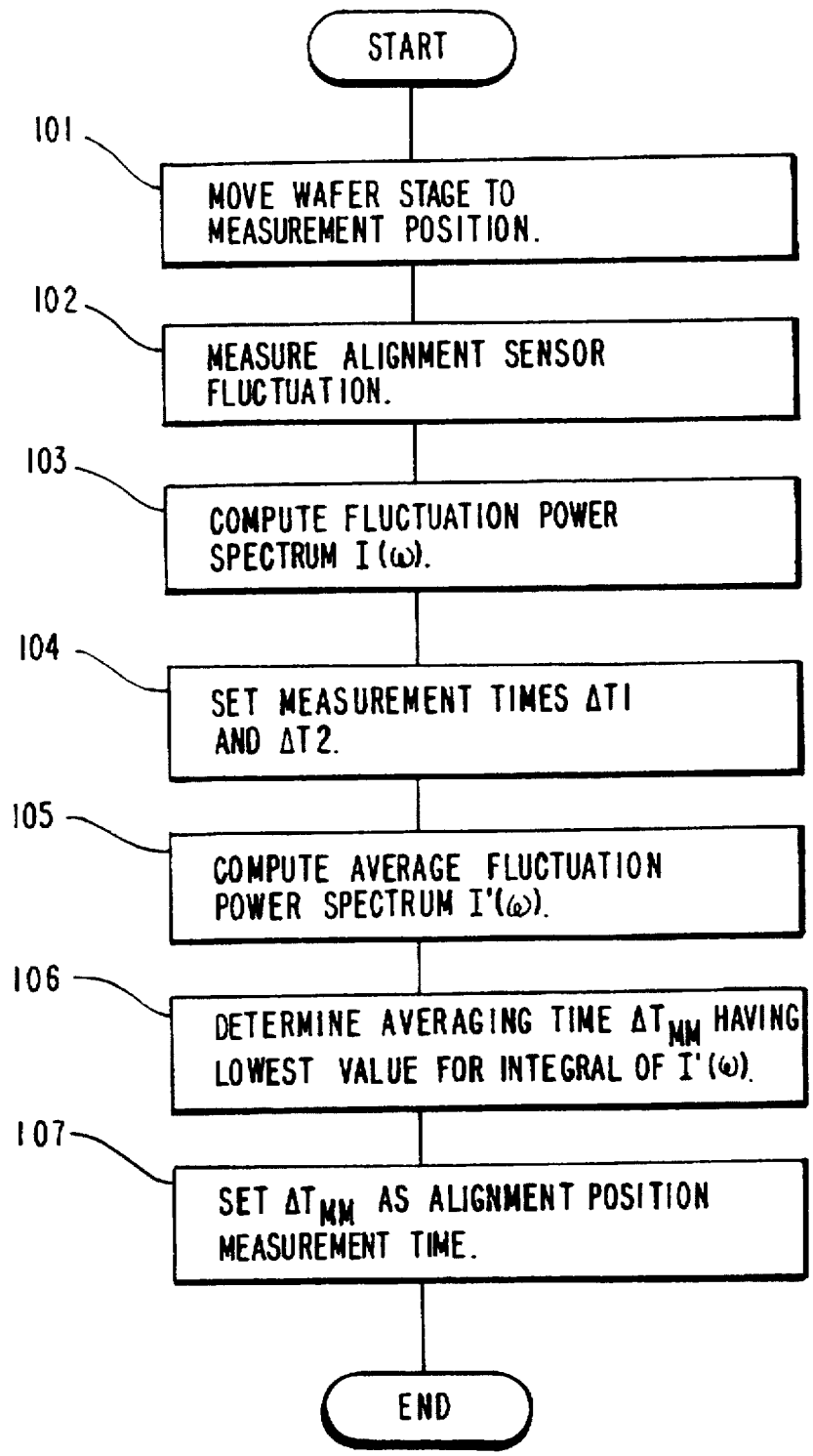
FIG. 1 is a flowchart showing an example of an embodiment of the position-sensing method according to the present invention.

Referring to the drawings, an embodiment of the sensing method and apparatus of the present invention will be described. In this example, the present invention is applied in a stepper-type projection-exposure system for exposing a reticle pattern onto the shot areas of a wafer in a single operation, wherein the LIA alignment sensors are used to perform wafer alignment in a TTL mode.

Figure 2:
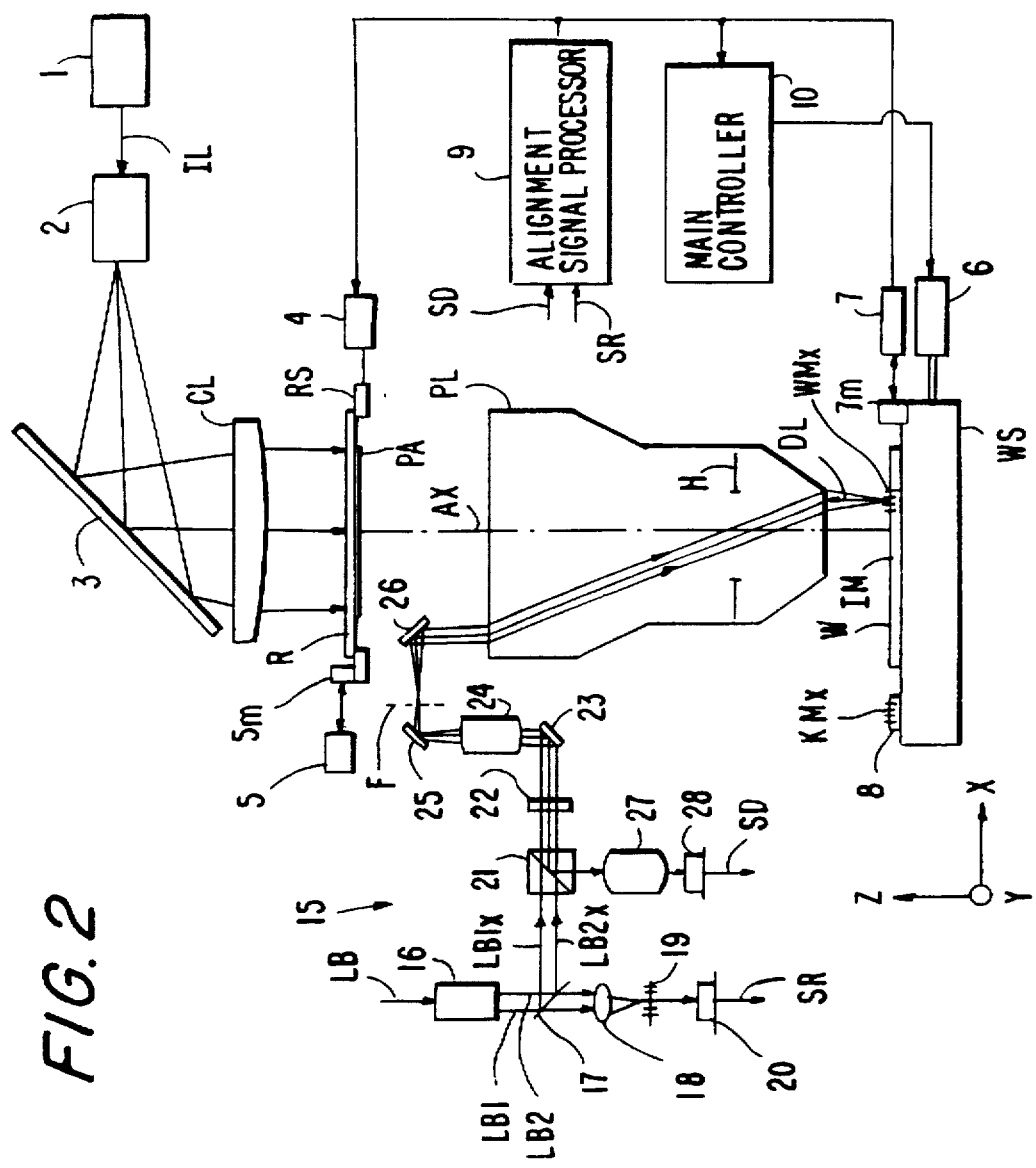
FIG. 2 is a simplified schematic diagram showing an example of a projection-exposure system used in an embodiment of the present invention.

Referring more particularly to FIG. 2, a simplified schematic diagram of a projection-exposure system according to a first embodiment of the present invention is shown. A light source 1 in FIG. 2 emits illumination light, IL, within the photosensitive wavelength band of the photoresist layer of the wafer W. The light used for illumination light IL might be, for example, G-line or I-line light from an ultrahigh-pressure mercury arc lamp, excimer laser light from an ArF or a KrF excimer laser, or an upper harmonic wavelength light from a copper vapor or a YAG laser.

During exposure, illumination light IL emitted from light source 1 is incident onto uniform illumination distribution optics 2, which has a "fly eye" lens. After having its illumination distribution made uniform and its spectrum reduced in uniform illumination distribution optics 2, the illumination light IL is reflected downward by a mirror 3. It then passes through a main condenser lens CL to flood the pattern area PA of a reticle R, with the light intensity evenly distributed over the reticle pattern area.

The pattern in the pattern area PA is reverse-image projected in the illumination light IL through double-ended (or single-ended) telecentric projection optics PL, reduced in size by a projection-reduction ratio β (e.g., ×one-fifth) onto one of the shot areas of the wafer W, which is mounted approximately even with an image-formation plane IM. For the following discussion, the Z-axis is defined to lie parallel to the optical axis AX of the projection lens PL, the X-axis to lie parallel to the page of FIG. 2 in a plane perpendicular to the Z-axis, and the Y-axis to lie perpendicular to the page.

The reticle R is secured on a reticle stage RS, which is configured to be movable in the X, Y, and rotation directions driven by a drive means 4. The coordinates of the reticle stage RS are constantly sensed (with a resolution on the order of 0.02 μm, for example) by a laser interferometer 5 and a moving mirror 5m. The mirror 5m is attached to the end of the reticle stage RS. The measurements taken by the laser interferometer 5 are supplied to a main controller 10. Based on these measurements, the main controller 10 controls the positioning of the reticle stage RS through the drive means 4.

The wafer W is placed in a wafer holder (θ table, not illustrated in order to avoid unnecessarily complicating the drawing), and loaded onto the wafer stage WS. For the step-and-repeat operation, the wafer stage WS is configured to be movable in two dimensions (in the X and Y directions), driven by a drive means 6. The stage WS can also be moved slightly in the Z direction. The X,Y coordinates of the wafer stage WS are constantly sensed (with a resolution on the order of 0.02 μm, for example) by a laser interferometer 7 and a moving mirror 7m. The mirror 7m is attached to the end of the wafer stage WS. The measurements taken by the laser interferometer 7 are supplied to the main controller 10. Based on these measurements, the main controller 10 controls the positioning of the wafer stage WS through drive means 6. The measurements taken by the laser interferometer 7 are also supplied to an alignment signal processor 9, which processes alignment signals.

Provided at each shot area of the wafer W are an X-axis mark and a Y-axis mark. These are diffraction-grating-type marks for sensing the position in the X and Y directions, respectively, of their particular shot area. The only such mark shown in FIG. 2 is the X-axis wafer mark WMx, which is the X-axis diffraction-grating mark for one of the shot areas of the wafer. The wafer mark WMx is a diffraction-grating mark that has its grating grooves formed at a pitch P along the measurement direction (the X-axis direction). The position of the wafer mark WMx along the X direction is sensed by an X-axis alignment sensor 15, an LIA alignment sensor used in the TTL mode (to be discussed later). The position in the Y direction of the corresponding Y-axis wafer mark (not illustrated) is similarly sensed by a Y-axis alignment sensor (not illustrated). The alignment of the applicable shot area in the exposure position is performed based on the results of these sensings.

Mounted on the wafer stage WS, adjacent to the wafer W, is a reference-mark member 8, installed so that its surface and that of the wafer W will be at the same height.

Formed on the surface of the reference-mark member 8 are an X-axis reference mark KMx, a diffraction-grating-type mark with grating grooves formed at the pitch P along the X direction that is the same as the X-axis wafer mark WMx, and a diffraction-grating-type Y-axis reference mark (not illustrated) that is the same as the Y-axis wafer mark.

These reference marks are normally used to perform measurements such as the distance between the exposure center and the center of detection of the alignment sensor 15 (the baseline measurements), for example. In this example, as will be described later, these reference marks are used when determining the measurement time for the purpose of processing the sensing results of the alignment sensor 15.

Next, the configuration of the LIA-type alignment sensor 15 used for the TTL alignment method of this example will be described. The description of this method relates specifically to the illustrated X-axis grating marks, but it should be appreciated that the Y-axis grating marks are utilized in the same manner.

In the alignment sensor 15 (FIG. 2), a coherent alignment-illumination light, in a wavelength band for which the photoresist layer on the wafer W has a low photosensitivity, is emitted from an alignment light source (not illustrated). In this example, a 633 nm laser beam LB from a He—Ne laser source, for example, is used as the alignment-illumination light.

The laser beam LB is incident on the LIA beam-forming optics 16, which includes a dual-beam frequency shifter. The LIA beam-forming optics 16 emits two linearly polarized laser beams LB1 and LB2, which are mutually interferable and separated in frequency by a specific frequency difference Δf (where Δf is on the order of 50 kHz, for example). Two laser beams are extracted from the laser beams LB1 and LB2 by a beam splitter (not illustrated) for use in a Y-axis alignment sensor (not illustrated). The remaining LB1 and LB2 light is directed onto a beam splitter 17, which reflects a portion of each beam to form the X-axis laser beams LB1x and LB2x.

The two laser beams transmitted by the beam splitter 17, which are separated in frequency by the frequency difference Δf, pass through a condenser lens 18 and are converged on a reference diffraction grating 19. Emitted therefrom in a near-normal direction is an interference beam (an alignment beam) formed from the pair of the diffraction light beams. This interference light is converted to an electrical signal by a photoelectric detector 20 (a photodiode, etc.). The photoelectric detector 20 outputs a reference-beat signal SR (which is converted to a sinusoidal waveform at the frequency Δf) to the alignment signal processor 9.

The linearly polarized X-axis laser beams LB1x and LB2x pass through a polarized light-beam splitter 21, are converted to circularly polarized light by a ¼-wave plate 22, and are reflected upward by a mirror 23. After being reflected by the mirror 23, the laser beams LB1x and LB2x pass through an objective lens 24 to be reflected horizontally by a mirror 25. The laser beams intersect at a focal plane F and are incident from the left onto a mirror 26 which is placed between the reticle stage RS and the projection optics PL.

The laser beams LB1x and LB2x are reflected by the mirror 26 and are incident onto the projection optics PL from its top left side, as illustrated in FIG. 2. The beams are converged into spot shapes by a pupil plane H within the projection optics PL and become incident upon the wafer mark WMx as parallel beams from two different directions. These beams are inclined at mutually symmetrical intersect angles θ relative to the pitch direction (X direction) of the wafer mark WMx, with a line that is parallel to the optical axis AX sandwiched between them.

With the laser beams LB1x and LB2x incident on the wafer mark WMx at the intersect angle θ, a first-order interference pattern is created in the X direction in the desired plane (the surface of the wafer W) perpendicular to the optical axis AX, in the space area in which LB1x and LB2x intersect. This interference pattern has a pitch P', which is one-half of P, the pitch of the wafer mark WMx (P'=P/2). This interference pattern migrates (flows) in the pitch direction (X direction) of the wafer mark WMx, responsive to Δf, the frequency difference between the laser beams LB1x and LB2x. V, the speed of migration of this interference pattern is given by the following equation.

$$V = \Delta f \cdot P' \quad \text{Equation 2}$$

This causes an interference light beam (heterodyne beam) DL, made up of ±-order diffraction light, to be emitted from the wafer mark WMx, advancing along a line that lies parallel to the optical axis AX. The flowing motion of the interference pattern causes the interference beam DL to have a beat wavefront that periodically changes back and forth between dark and light. After passing through the projection optics PL, this interference beam DL is reflected horizontally by the mirror 26, to become incident upon the mirror 25. After being reflected downwardly by the mirror 25, the interference beam DL passes through the objective lens 24, to be reflected horizontally by the mirror 23.

The interference beam DL, which emerges from the mirror 23 circularly polarized in the opposite direction from its direction of polarization at incidence, now passes through the quarter-wave plate 22 and is converted to a linear-polar light. After being reflected by the polarized beam splitter 21, the interference beam DL passes through a pupil relay system 27, and is converted to an electrical signal by a photoelectric detector 28 (a photodiode, etc.). The wafer beat signal SD output by the photoelectric detector 28 is changed to a sinusoidal a.c. signal waveform at a frequency Δf that corresponds to the light-dark change cycle of the interference pattern on the wafer mark WMx, and is supplied to the alignment signal processor 9.

In the alignment signal processor 9, the phase difference Δφ (in degrees) in the waveform of the wafer-beat signal SD is detected, with the phase of the reference-beat signal SR (the reference signal) as the reference. Within a ±180-degree range, this detected phase difference Δφ (in degrees) roughly correponds to ΔX, the magnitude of the relative positional displacement of the wafer mark WMx. Within a range of ±P/2, this magnitude of the relative positional displacement ΔX can be considered to be an analog of the magnitude of the positional displacement of the wafer mark WMx, with the reference diffraction grating 19 as a reference, or the magnitude of the positional displacement of the wafer mark WMx, with respect to the center of the area of the intersection of the laser beams LB1x and LB2x on the wafer W.

$$\Delta X = \Delta \phi \cdot P / 360° \quad \text{Equation 3}$$

Thus if P, the pitch of the wafer mark WMx, is 8 μm, and the phase-detection resolution of the alignment signal processor 9 is 0.2 degrees, then the measurement resolution for the measurement of the magnitude of the positional displacement ΔX will be 0.0044 (0.2×8/360) μm. In reality, due to the influence of noise and other effects, the practical measurement resolution is on the order of 0.01 μm (0.4 degrees of the phase). This sensing method is the so-called "heterodyne method." In this method, if the magnitude of the positional displacement of the wafer W is within a positional error range of ±P/2, a high resolution sensing of the positional displacement magnitude is possible, even in the static state (i.e., with the wafer stage stationary).

In the alignment signal processor 9, the phase difference Δφ of this wafer-beat signal SD is supplied to the main controller 10. In the main controller 10, the X-coordinate of the wafer stage WS is servocontrolled by driving means 6 to control the phase difference Δφ to match a prescribed target value (e.g., zero degrees), with a sensing accuracy within, for example, 0.4 degrees. In the alignment signal processor 9, samplings of the X-coordinate of the wafer stage WS, as measured by the laser interferometer 7, are taken during the time this phase difference Δφ matches the target value to within the prescribed sensing accuracy, and these X-coordinate values are then taken as XM, the X-axis position of the wafer mark WMx.

In reality, however, the phase of the wafer-beat signal SD tends to have high-speed oscillations due to factors such as equipment vibration and fluctuation in the refractive index of the air. Therefore, if during the time Δφ that the phase difference of the wafer-beat signal SD matches the target value to within the prescribed sensing accuracy, the time-series samplings of the measurements made by the laser interferometer 7 during the prescribed sampling period are taken, and XM, the position in the X direction of the wafer mark WMx, is found, the time-series data of this position XM will also have high-speed oscillations.

Figure 3:
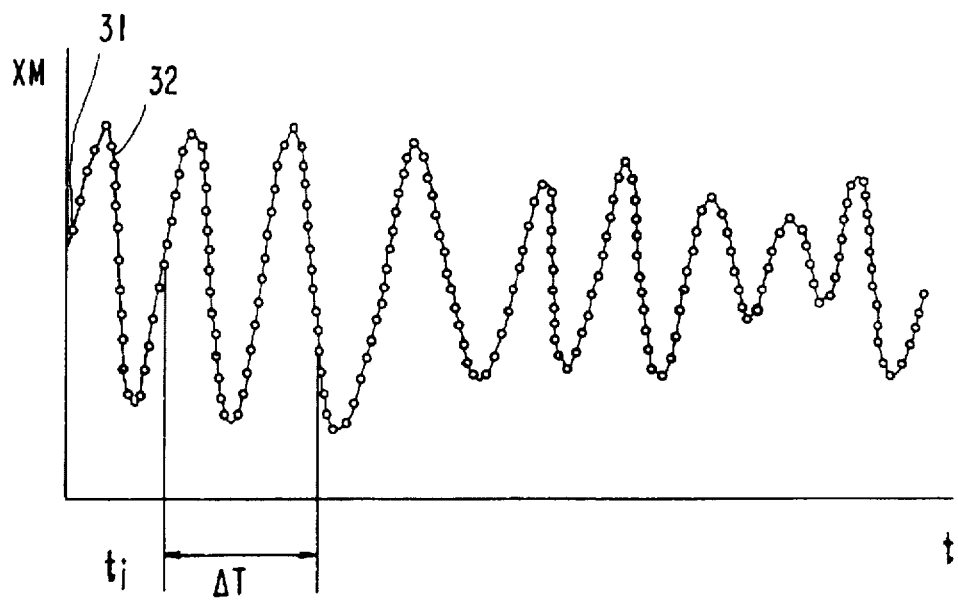
FIG. 3 shows an example of sensed wafer-mark-position time-series data.

FIG. 3 is a graphical representation showing variations in XM (the X-axis position of the wafer mark WMx) with time as determined in this manner. The horizontal axis in FIG. 3 represents time t, and the vertical axis the measured position XM. The dotted line starting at dot 31 indicates the position XM data measured over a given sampling period. Since the position XM data measured over time exhibits high-speed oscillations, as shown in FIG. 3, the average value of the position XM data over an averaging time ΔT, starting at a given point in time (time $t_i$, for example) can be taken to be the position of the wafer mark WMx.

At first glance, it would appear that the longer the averaging time ΔT is made, the more accurate will be the sensed position of the wafer mark WMx. In fact, however, due to the oscillation-cycle period of the position XM data, etc., the wafer mark WMx position-sensing precision does not necessarily improve monotonically with an increasing averaging time ΔT.

In addition, although a high-precision sensing of the position of the wafer mark WMx can be accomplished by making the averaging time ΔT quite long in comparison to the average oscillation cycle of the position XM data, this increases the measurement time. This, in turn, decreases the throughput of both the exposure process and the alignment process. Accordingly, in this example, ΔT, the averaging time of the XM position data (the time-series data from the measurements of the wafer mark WMx position) is optimized so that the most accurate sensing of the wafer mark WMx position, within a given permissible measurement time, can be performed.

FIG. 1 is a flowchart of the steps involved for one example of the method incorporating the principles of the present invention for optimizing the averaging time ΔT within a given permissible measurement time. First, in step 101 of FIG. 1, the wafer stage WS (FIG. 2) is moved by commands from the main controller 10 to position the X-axis reference mark KMx on the reference-mark member 8 within the area being illuminated by the laser beams LB1 and LB2 from the alignment sensor 15 (the detection range). In step 102, with the wafer stage WS in the static state, the alignment sensor 15 detects Δφ (the phase difference of the wafer-beat signal SD corresponding to the reference mark KMx) using the phase of the reference-beat signal SR as the reference, and supplies it to the main controller 10.

In the main controller 10, the position of the wafer stage WS is servocontrolled by driving means 6 to maintain a matched condition between the phase difference $\Delta\phi$ and a given target value. In the alignment signal processor 9, while the above operation is going on, during the time the signal SD phase difference $\Delta\phi$ matches the target value within a given sensing accuracy, XM, the position of the reference mark KM in the X direction, is sensed in a time-series fashion by sampling the X-coordinates of the wafer stage WS as measured by the laser interferometer 7 during a given sampling period. The data obtained as the result of this sampling is the position XM time-series data that varies (fluctuates) over time t, the same as the time-series data for a wafer mark in FIG. 3. This time-series data is supplied to the main controller 10 as measurements of the LIA alignment sensor 15 fluctuation.

Next, in step 103, the main controller 10 computes the fluctuation power spectrum $I(\omega)$ by taking the discrete Fourier transform of the fluctuation measurements obtained in step 102 in which $\omega$ is an angular frequency $2\pi f$ and f is frequency. In this case, for example, with the position XM time-series data of FIG. 3 taken to be the time-series data for the reference mark KMx, the function of the curve 32 connecting these time-series data can be expressed as follows:

$$XM = g(t) \qquad \text{Equation 4}$$

Also, if the Fourier transform (actually, the discrete Fourier transform) of the function g(t) is expressed as $F\{g(t)\}$, the power spectrum $I(\omega)$ can be expressed as $|F\{g(t)\}|^2$.

Figure 4:
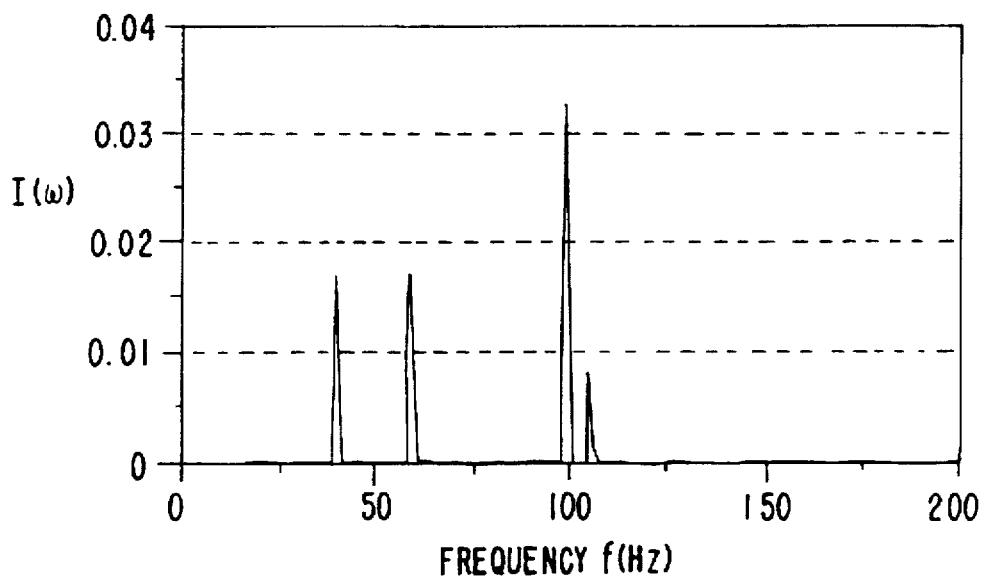
FIG. 4 shows an example of a power spectrum of fluctuations in sensed positions.

An example of a fluctuation power spectrum $I(\omega)$ obtained in step 103 is shown in FIG. 4, which has a frequency f (Hz) plotted on its horizontal axis, and a power spectrum $I(\omega)$ on the vertical axis. This power spectrum is normalized so that the integral of $I(\omega)$ from 0 to 200 Hz (the maximum frequency) will be 1. As shown in FIG. 4, the $I(\omega)$ power spectrum has spikes near 45 Hz, 55 Hz, 100 Hz, and 105 Hz, with the 100-Hz spike being especially large.

Next, in step 104, two different measurement time periods $\Delta T1$ and $\Delta T2$ ($\Delta T1 < \Delta T2$), within a specific permissible measurement time, are set in the main controller 10. In the following step 105, the fluctuation power spectrum $\Gamma(\omega)$ obtained by averaging the time-series data between the two measurement periods $\Delta T1$ and $\Delta T2$, and changed by a given step function within the averaging time $\Delta T$, is computed using Equation 5 below.

$$\Gamma(\omega) = I(\omega)\{\sin(\omega\Delta T/2)/(\omega\Delta T/2)\}^2 \qquad \text{Equation 5}$$

Now, $\sigma^2$, the dispersion of the averaged time-series data matches the integral of $I(\omega)$, the power spectrum of the fluctuations in this averaged time-series data. Therefore, in the next step, step 106, the value of $J(\Delta T)$, the integral of the averaged fluctuation power spectrum $\Gamma(\omega)$ for the averaging time $\Delta T$ between the two measurement periods $\Delta T1$ and $\Delta T2$ is computed in the main controller 10. That is, with $f_{max}$ as the maximum value of the frequency f (200 Hz in this case), the integral of $J(\Delta T)$ is given by the following equation. In this equation, the averaged fluctuation power spectrum is expressed as $\Gamma(2\pi f)$.

$$J(\Delta T) = \int_0^{fmax} \Gamma(2\pi f) df \qquad \text{Equation 6}$$

FIG. 5 shows a plot of the results obtained in the calculations of the averaged fluctuation power spectrum $\Gamma(\omega)$. In FIG. 5, the averaging time (the measurement time) $\Delta T$ is shown on the horizontal axis, and the integral of the power spectrum over that time $\Gamma(\omega)$ (i.e., $\sigma^2$, the dispersion of the time-series data, averaged over the averaging time $\Delta T$, for XM, the measured position of the reference mark KMx). For the example shown in FIG. 5, the measurement times $\Delta T1$ and $\Delta T2$, discussed above, were set at 0.015 and 0.035 seconds, respectively, with a permissible measurement time of approximately 0.035 seconds. As shown by the curve 33 in FIG. 5, the dispersion $\sigma^2$ drops sharply between the averaging times (the measurement times) $\Delta T$ of 0.015 and 0.02 seconds, but then for $\Delta T$ times of greater than about 0.02 seconds, the dispersion $\sigma^2$ tends to vary only gradually with respect to the averaging time $\Delta T$.

From the computation results of FIG. 5, it can be seen that $\Delta T_{MM}$, the value of the averaging time $\Delta T$ when the dispersion $\sigma^2$ is at its lowest point, is approximately 0.029 seconds. The main controller 10 computes and saves this $\Delta T_{MM}$ value (the averaging time $\Delta T$ that will give the minimum dispersion $\sigma^2$). In step 107, based on the results of this computation, the main controller 10 determines this averaging time $\Delta T_{MM}$ as the averaging time for the position XM data measured in a time-series fashion by the alignment sensor 15 (i.e., the position-measurement time), and sets this as the position-measurement time $\Delta T_{MM}$ in the alignment signal processor 9. The alignment signal processor 9 then takes the result obtained by the averaging during this position-measurement time $\Delta T_{MM}$, the XM time-series data obtained for the wafer mark being measured, and supplies it to the main controller 10 as the position of the wafer mark being measured. This makes it possible to realize a highly accurate position sensing under optimum measurement time conditions and with a minimum dispersion of the position measurement results without reducing throughput.

Furthermore, although in this example, the alignment sensor 15 was used to sense the position of the reference mark KMx on the reference-mark member 8 only, the same procedure is used to set optimized measurement times for each wafer mark at each shot area of the wafer and the optimum measurement time alignment performed for each shot area. This has the effect of correcting the position of the wafer stage WS for changing conditions such as vibrations in various parts of the system and air fluctuations.

Because, according to the position-sensing method and apparatus incorporating the principles of the present invention, the averaging time during which the fluctuations in the position-sensing results are at a minimum is used as the measurement time, an advantage is realized in that the position sensing of a mark to be measured can be performed with high precision without making the measurement time in the LIA method excessively long. Thus, overlay accuracy can be improved while maintaining high throughput in the alignment and exposure processes.

There is also an advantage in that the averaging time, when the fluctuations (the dispersion) within a given averaging time will be at a minimum, can easily be found by determining the power spectrum of the fluctuations in the positions sensed based on the beat-signal phase; and from this power spectrum, deriving the power spectrum of the fluctuations time-averaged within a specific averaging time, and the integral of this power spectrum; and then defining the averaging time during which the value of this integral is at its lowest point as the measurement time of the position of the diffraction-grating-type mark.

The present invention is also applicable to systems in which LIA alignment sensors are used in an off-axis or TTR alignment mode. In addition, the present invention is not limited to application in stepper-type projection-exposure systems, but can also be used in step-and-scan systems in which, with a portion of the reticle pattern being projected onto the wafer, the reticle and the wafer are scanned simultaneously, to successively transfer the reticle pattern to each shot area on the wafer. Thus the present invention is not limited to the embodiment described above, but various modifications will become possible for those skilled in the art after receiving the teachings of the present disclosure without deviating from the scope thereof.

What is claimed is:

1. A method for establishing the desired measurement time for sensing the position of a diffraction-grating-type mark using a beat signal developed from at least two laser beams impinging on said mark comprising the steps of:

sequentially reading the position of said mark during two different measurement time periods based on the phase of said beat signal;

computing the power spectrum of the averaged fluctuations in said readings for an averaging time between said two different time periods; and computing the integral of said power spectrum whereby the averaging time during which said integral is at its lowest value equals said desired measuring time.

2. A method for establishing the desired measurement time for sensing the position of a diffraction-grating-type mark using a beat signal developed from at least two laser beams impinging on said mark comprising the steps of:

sequentially reading the position of said mark based on the phase of said beat signal to provide first time-series data;

computing a first power spectrum of any fluctuations occurring in said first time-series data;

sequentially reading the position of said mark during two different time periods to provide second time-series data;

computing a second power spectrum of averaged fluctuations in said readings for an averaging time between said two different time periods; and computing the integral of said second power spectrum whereby the averaging time during which said integral is at its lowest value equals said desired measuring time.

3. A position-sensing method comprising the steps of:

emitting two light beams having interferability and mutually differing frequencies onto a diffraction-grating-type mark formed on a substrate from different directions;

generating a beat signal by photoelectric detection of interference light made up of diffraction light of each of said two light beams from said diffraction-grating-type mark;

sensing the position of said diffraction-grating-type mark based on the phase of said beat signal; and using the averaging time during which fluctuations of said sensed position are at their lowest in measurement results averaged in a specific range of averaging times of positions sensed based on the phase of said beat signal as the measurement time of the position of said diffraction-grating-type mark.

4. A position-sensing method, as claimed in claim 3, including the steps of:

determining a first power spectrum of fluctuations in positions sensed based on the phase of said beat signal;

computing from said first power spectrum a second power spectrum of fluctuations in measurement results averaged during each averaging time within said range of specific averaging time;

computing the integral of said second power spectrum; and using the averaging time during which said integral is at its lowest value as the measurement time of the position of said diffraction-grating-type mark.

5. Apparatus for establishing the desired measurement time for sensing the position of a diffraction-grating-type mark using a beat signal developed from at least two laser beams impinging on said mark comprising:

means for sequentially reading the position of said mark during two different measurement time periods based on the phase of said beat signal;

means for computing the power spectrum of the averaged fluctuations in said readings for an averaging time between said two different time periods; and means for computing the integral of said power spectrum whereby the averaging time during which said integral is at its lowest value equals said desired measuring time.

6. Apparatus for establishing the desired measurement time for sensing the position of a diffraction-grating-type mark using a beat signal developed from at least two laser beams impinging on said mark comprising the steps of:

means for sequentially reading the position of said mark based on the phase of said beat signal to provide first time-series data;

means for computing a first power spectrum of any fluctuations occurring in said first time-series data;

means for sequentially reading the position of said mark during two different time periods to provide second time-series data;

means for computing a second power spectrum of averaged fluctuations in said readings for an averaging time between said two different time periods; and means for computing the integral of said second power spectrum whereby the averaging time during which said integral is at its lowest value equals said desired measuring time.

7. A position-sensing apparatus comprising:

means for emitting two light beams having interferability and mutually differing frequencies onto a diffraction-grating-type mark formed on a substrate from different directions;

means for generating a beat signal by photoelectric detection of interference light made up of diffraction light of each of said two light beams from said diffraction-grating-type mark;

means for sensing the position of said diffraction-grating-type mark based on the phase of said beat signal; and means for using the averaging time during which fluctuations of said sensed position are at their lowest in measurement results averaged in a specific range of averaging times of positions sensed based on the phase of said beat signal as the measurement time of the position of said diffraction-grating-type mark.

8. A position-sensing apparatus, as claimed in claim 7, including:

means for determining a first power spectrum of fluctuations in positions sensed based on the phase of said beat signal;

means for computing from said first power spectrum, a second power spectrum of fluctuations in measurement results averaged during each averaging time within said range of specific averaging times;

means for computing the integral of said second power spectrum; and means for using the averaging time during which said integral is at its lowest value as the measurement time of the position of said diffraction-grating-type mark.

* * * * *